United States Patent
Dubash et al.

(10) Patent No.: US 7,388,939 B2
(45) Date of Patent: Jun. 17, 2008

(54) FRACTIONAL-R FREQUENCY SYNTHESIZER

(75) Inventors: Noshir Behli Dubash, San Pedro, CA (US); Robert Tso, South San Gabriel, CA (US)

(73) Assignee: SiRF Technology, Inc., San Jose, CA (US)

( * ) Notice: Subject to any disclaimer, the term of this patent is extended or adjusted under 35 U.S.C. 154(b) by 0 days.

(21) Appl. No.: 10/494,322

(22) PCT Filed: Oct. 31, 2002

(86) PCT No.: PCT/US02/34891

§ 371 (c)(1),
(2), (4) Date: Nov. 1, 2004

(87) PCT Pub. No.: WO03/039002

PCT Pub. Date: May 8, 2003

(65) Prior Publication Data

US 2005/0063505 A1    Mar. 24, 2005

Related U.S. Application Data

(60) Provisional application No. 60/335,678, filed on Oct. 31, 2001.

(51) Int. Cl.
*H03D 3/24*    (2006.01)

(52) U.S. Cl. .................................. 375/376; 327/105
(58) Field of Classification Search ................ 375/376, 375/247, 371, 375, 362, 226; 327/105, 141, 327/7, 156
See application file for complete search history.

(56) References Cited

U.S. PATENT DOCUMENTS

| | | | | |
|---|---|---|---|---|
| 5,917,383 A * | 6/1999 | Tso et al. | ...................... | 331/57 |
| 6,236,278 B1 * | 5/2001 | Olgaard | ....................... | 331/25 |
| 6,456,164 B1 * | 9/2002 | Fan | ............... | 331/16 |
| 2001/0036817 A1 * | 11/2001 | Yamada et al. | ............. | 455/260 |
| 2004/0041638 A1 * | 3/2004 | Vilcocq et al. | ............... | 331/16 |
| 2005/0231408 A1 * | 10/2005 | Keaveney et al. | .......... | 341/143 |

OTHER PUBLICATIONS

Perrott, M. H. "Techniques for high data rate modulation and low power operation of fractional-N frequency synthesizers," Ph.D. dissertation, MIT, 1997.*

* cited by examiner

*Primary Examiner*—Jean B. Corrielus
(74) *Attorney, Agent, or Firm*—The Eclipse Group

(57) ABSTRACT

A fractional-R synthesizer having a divider with rational increments and configurable in rational steps able to generate a plurality of frequencies in rational increments from a reference frequency. A voltage-controlled oscillator frequency ($f_{VCO}$) is related to the reference frequency ($f_{REF}$) by: $f_{REF} = f_{VCO}/R_{AVG}$, where $R_{AVG}$ is the average value of the rational divide value "R" over a large number of reference cycles.

23 Claims, 5 Drawing Sheets

FRACTIONAL-R FREQUENCY SYNTHESIZER

CROSS-REFERENCE TO RELATED APPLICATIONS

This application is a 371 of PCT/US02/34891, filed Oct. 31, 2002 which claims the benefit of Provisional Patent Application Ser. No. 60/335,678 filed on Oct. 31, 2001, and entitled "FRACTIONAL-R FREQUENCY SYNTHESIZER," which is herein incorporated by reference.

BACKGROUND OF THE INVENTION

1. Field of the Invention

This invention relates generally to frequency synthesizers, and in particular to fractional frequency synthesizers.

2. Related Art

A diagram of a conventional phase-locked loop (PLL) synthesizer 100 is shown in FIG. 1. The conventional PLL contains a fixed integer divider 102, whose modulus N provides a fixed relation between the external reference frequency $f_{REF}$ 104 and the internal voltage-controlled oscillator (VCO) 106 frequency $f_{VCO}$. The output of the integer divider 102 is compared to the reference frequency 104 by the phase-frequency detector (PAD) 108. The PAD 108 produces an error signal, which is proportional to the phase error between the reference frequency 104 and the integer divider 102 output. This error signal is filtered by loop filter 110 and applied to the VCO 106 input, which increases or decreases the VCO frequency until the PLL is locked. Once locked, the VCO frequency is given by: $f_{VCO}=f_{REF}*N$. Thus, with a conventional PLL only a single reference frequency can be used for a given design, and that reference frequency must be an integer multiple of the desired VCO frequency. This places limitations on application and design.

Fractional synthesizers enable the synthesis of a VCO frequency which is not an integer multiple of the reference frequency. In a fractional-N type synthesizer a variable integer frequency divider, having an integer divide value "n" is used, where "n" can be switched between different integer values in integer steps. A modulator is used to vary the modulus "n" of the variable integer frequency divider.

A diagram of a fractional-N synthesizer 200 is shown in FIG. 2. In the fractional-N synthesizer, the instantaneous relation between the output of variable integer divider 204 and frequencies generated by the VCO 106 is given by $f_{DIV}=f_{VCO}/n$, where n=. . . , N−1, N, N+1, . . . . By the modulator 202 dynamically varying n used by the variable integer divider 204 between the different integer values, fractional values of n may be synthesized, when averaged over many cycles. The modulator is clocked by the output of divider 204. The range over which "n" is dynamically varied depends on the type and order of the modulator 202. Furthermore, by having more module in the integer divider 102 than are needed for the fractional synthesis, the value "N" around which the dynamic modulation takes place, can be set to different integer values for different frequency plans.

This is illustrated in the fractional-N synthesizer 300 by the "integer set" input in FIG. 3. Thus, a large range of reference frequencies 104 can be used for a given fractional-N synthesizer design. The flexibility of fractional-N synthesis does result in some degradation of synthesizer performance, compared to a conventional PLL 100. The dynamic modulation is perpetually pulling the loop away from an ideal locked condition, and the loop is perpetually compensating for this by sending error signals to the VCO. This perpetual perturbation of the PLL causes excess phase noise in the spectrum of the VCO Output.

Most known fractional-N synthesizers use sigma-delta (ΣΔ) modulators 304 to control the modulus of the variable divider 302. The ΣΔ modulators 304 used in fractional-N synthesizers are purely digital circuits that produce one or more patterns of 1's and 0's as their output. The periodicity and frequency content of the digital patterns produced will determine the spectral quality of the synthesizer output. ΣΔ modulators 304 consist of one of more digital integrators or accumulators. Higher order modulators (with two or more integrators) shape the noise added to the VCO 106 spectrum, by pushing the quantitation noise to higher frequencies, where the loop filter 110 of the PLL can more easily filter it. The type and order of the ΣΔ modulator 304 determines the exact shape of the noise shaping function, and has a direct impact on the noise in output spectrum of the synthesizer.

There are two types of ΣΔ modulators commonly used in fractional-N synthesizers:

(1) Cascade or MASH Modulators: This topology is a cascade of two or more integrators or accumulators. The output of one accumulator is the input of the following. There are feed-forward paths from the overflow outputs of each accumulator to the final output, but there are no feedback paths external to the accumulators. Having no feedback is what distinguishes MASH modulators from the other types of ΣΔ modulators. It is also this property that gives MASH modulators the advantage of being unconditionally stable. MASH modulators are easy to design and implement and produce compact designs. The disadvantages of MASH modulators include: 1) the noise shaping function depends only on the order of the modular (which is equal to the number of integrators), and cannot optimized for the PLL; 2) MASH modulators always have multi-bit outputs which require multi-modulus dividers.

(2) Feedback Modulators: Feedback modulators have one or more feedback paths external to the integrators. There is usually at least one feedback path from output to the input. Feedback modulators may also have one or more feed-forward paths. As with MASH modulators, the number of integrators determines the order of the modulator. Unlike the MASH modulator there is more flexibility in the design by the choice of the feedback and forward paths and the coefficients of the feedback and feed-forward paths. Although the control of the noise shaping function is desirable, it also makes designs more complicated. Unlike the MASH modulator the feedback modulator is NOT unconditionally stable and requires careful choice of the feedback and feed-forward paths and coefficients to ensure stability. The feedback modulator may have a single bit output, which only requires a dual modulus divider, however multi-bit outputs are often used to improve the noise shaping. A generalized description of feedback type modulators is provided in reference: K. Chaos et. al, "A higher order topology for interpolative modulators for over sampling A/D converters", IEEE Transactions on Circuits and Systems, vol. 37, No. 3, pp. 309-318, March 1990.

U.S. Pat. No. 5,038,117, which is incorporated by reference herein, describes a fractional-N type synthesizer, using cascade or MASH type ΣΔ modulator. A third order MASH modulator is described and the generalized application of this method is illustrated for an $M^{th}$ order MASH modulator. In this architecture the number of control bits applied to the input of the divider are equal to the order of the modulator. Thus, for a $3^{rd}$ order modulator, the modulus of the divider varies dynamically between eight states: N−3, N−2, N−1, N, N+1, N+2, N+3, and N+4, where N is the nominal divide ratio. This represents significant perturbation of the PLL.

Thus, there is a need in the art for a fractional-R synthesizer that can be switched in rational values that eliminate the limitations of known fractional-N type synthesizers.

SUMMARY

To minimize the limitations in the prior art, and to minimize other limitations that will become apparent upon reading and understanding the present specification, an embodiment of a fractional-R frequency synthesizer is described. Like the fractional-N synthesizer, the fractional-R synthesizer enables the synthesis of a VCO frequency which is not an integer multiple of the reference frequency. Unlike the fractional-N the fractional-R synthesizer uses a variable rational frequency divider, having a rational divide value "R", where "R" can be switched between different rational values in rational steps "r". The fractional-R synthesizer can be used with all types of $\Sigma\Delta$ modulators, with single or multiple bit outputs. The choice and implementation of the modulator depends on the accuracy and noise shaping required. The VCO And reference frequency are related by: $f_{REF} = f_{VCO}/R_{AVG}$, where $R_{AVG}$ is the average value of R over a large number of reference cycles.

A difference between the fractional-N and the fractional-R synthesizer is the size of the steps between adjacent divider module. The smaller steps in the fractional-R synthesizer cause less perturbation of the PLL synthesizer when the divider value is switched between different states. Smaller steps result in smaller phase error correction signals at the output of the PFD, which results in lower phase noise for the synthesizer. Unlike the fractional-N synthesizer, which requires a variable integer divider, the fractional-R synthesizer requires a variable rational divider.

Other systems, methods, features and advantages of the invention will be or will become apparent to one with skill in the art upon examination of the following figures and detailed description. It is intended that all such additional systems, methods, features and advantages be included within this description, be within the scope of the invention, and be protected by the accompanying claims.

BRIEF DESCRIPTION OF THE FIGURES

The invention can be better understood with reference to the following figures. The components in the figures are not necessarily to scale, emphasis instead being placed upon illustrating the principles of the invention. Moreover, in the figures, like reference numerals designate corresponding parts throughout the different views.

DETAILED DESCRIPTION

Two preferred embodiments of the fractional-R synthesizer are described. They differ in the implementation of the VCO and the rational divider. We note that a rational divider must have timing information within a fraction of a VCO cycle. If the duty cycle of the VCO Is very close to 50%, then we have timing information available every half VCO cycle. This information can be used to implement a multi-modulus divider with minimum rational steps of r=0.5. A 0.5 minimum step rational divider is described in detail in reference: M. H. Perrott, "Techniques for high data rate modulation and low power operation of fractional-N frequency synthesizers," Ph.D. dissertation, MIT, 1997, and will be summarized in the description of FIG. 5.

To implement a divider with r<0.5 we must have access to multiple phases of the VCO, to break the VCO cycle into smaller fractions. This is possible in a ring oscillator VCO. A ring oscillator consists of a number of digital buffers connected in series to form a ring, with an overall inversion in the signal around the ring. The ring will then oscillate at a frequency inversely proportional to the total delay around the ring. A different phase of the oscillator frequency is available at the output of each buffer, so that the number of phases available is equal to the number of stages in the ring. Thus, the greater the number of stages in the ring, the smaller the minimum step size r of the rational divider that can be implemented. An implementation with r=0.25 will be described in FIG. 6.

Figure 1:
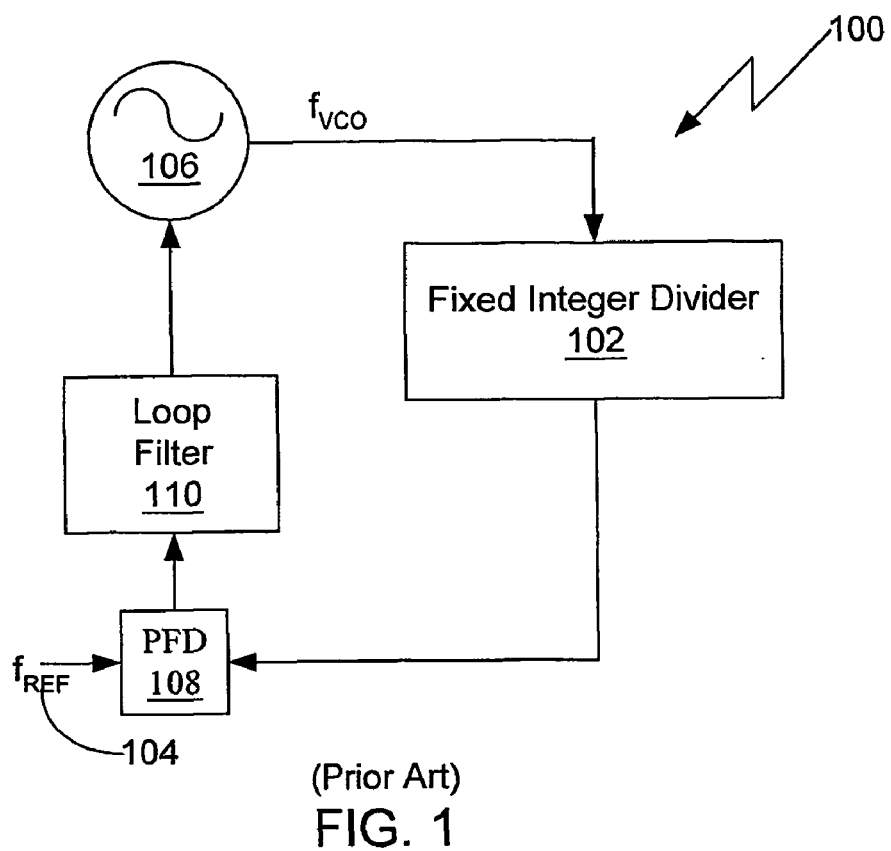
FIG. 1 is a block diagram of a conventional phase-locked loop (PLL) synthesizer.
Figure 2:
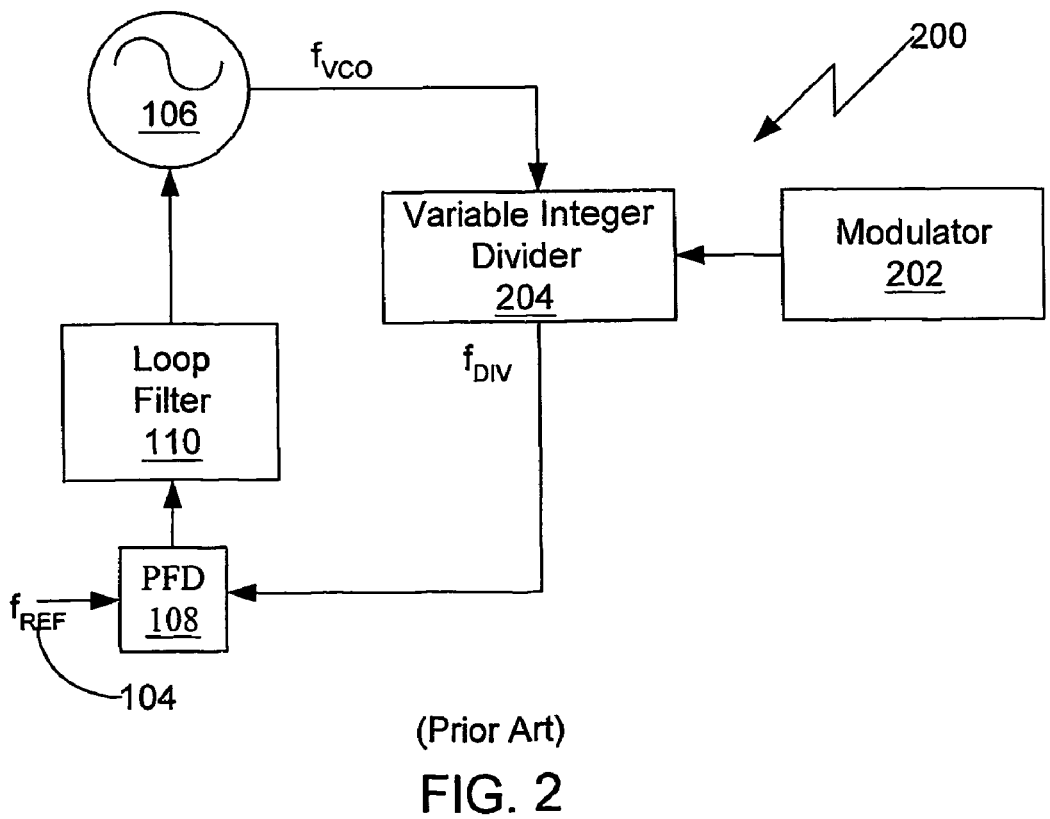
FIG. 2 is a block diagram of a conventional fractional-N synthesizer.
Figure 3:
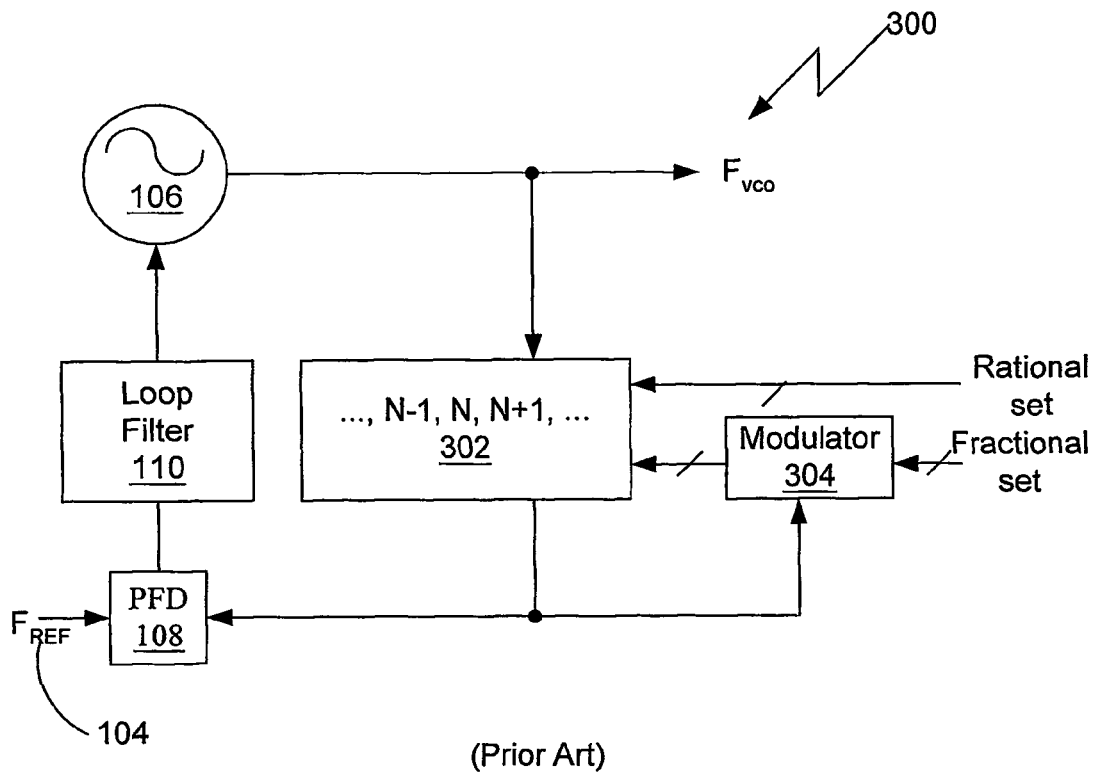
FIG. 3 is a block diagram of a conventional fractional-N synthesizer having a range of reference frequencies.
Figure 4:
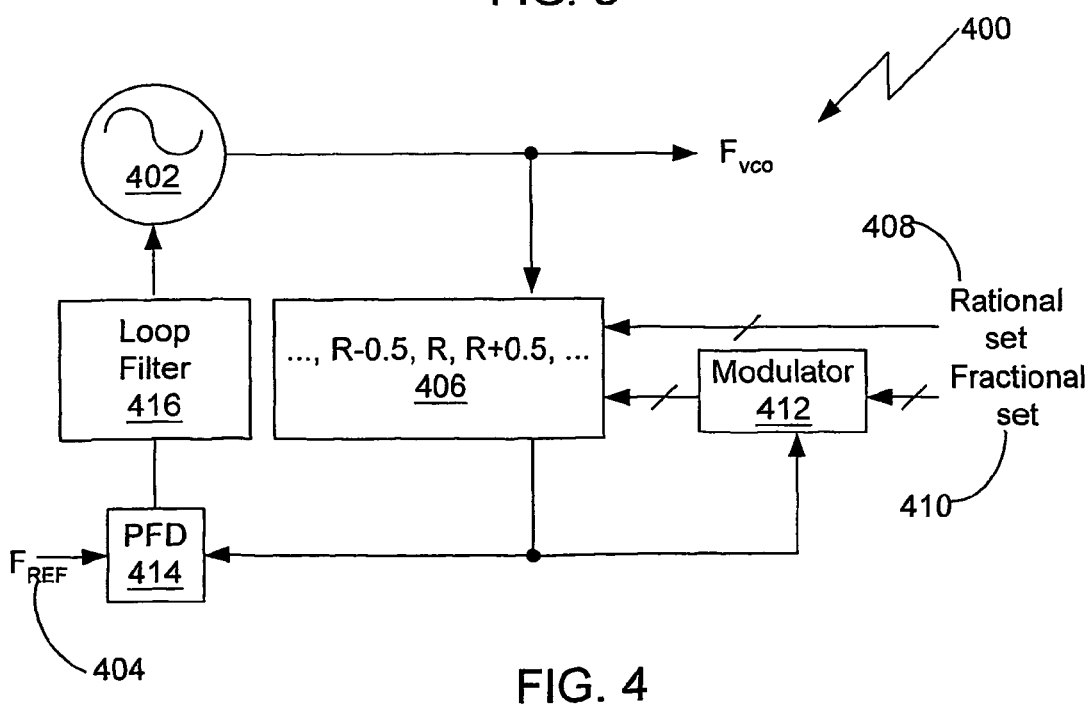
FIG. 4 is a block diagram of a fractional-R synthesizer.

In FIG. 4, a block diagram of a fractional-R synthesizer 400 is shown. Like the fractional-N synthesizer 300, the fractional-R synthesizer 400 enables the synthesis of a frequency generated by the VCO 402 which is not an integer multiple of the reference frequency 404. Unlike the fractional-N 300 the fractional-R synthesizer 400 uses a variable rational frequency divider 406, having a rational divide value "R" 408, where "R" 408 can be switched between different rational values in rational steps "r" 410. The minimum rational step "r" 410 is a fraction of unity such that minimum rational step r=1/N, where N is any integer. The divider value "R" 408 is a multiple of "r" 410 such than R/r=integer. As, with a fractional-N synthesizer 300 any fractional divider value can be synthesized by dynamically modulating via modulator 412 the value of R 408 between several states. Some examples for R states, which may be used in dynamic modulation, are:

| | |
|---|---|
| R = 28.0, 28.5, 29.0, 29.5 | r = 0.5 |
| R = 73.25, 73.50, 73.75, 74.00, 74.25, 74.50, 74.75, 75.00 | r = 0.25 |
| R = 33.125, 33.250 | r = 0.125 |

These examples illustrate only some combinations; in principle any minimum step size "r" 410 can be used with any number of dynamically switched states. The fractional-R synthesizer 400 can be used with all types of $\Sigma\Delta$ modulators, with single or multiple bit outputs. The choice and implementation of the modulator 412 depends on the accuracy and noise shaping required. The VCO 402 and reference frequency 404 are related by: $f_{REF} = f_{VCO}/R_{AVG}$, where $R_{AVG}$ is the average value of R over a large number of reference cycles. The VIC 402 is responsive to an error signal derived by PFD 414 and filtered by loop filter 416.

One of the differences between the fractional-N synthesizer 300 and the fractional-R synthesizer 400 is the size of the steps between adjacent divider moduli. The smaller steps in the fractional-R synthesizer 400 results in less perturbation of the PLL synthesizer when the divider value is switched between different states. Smaller steps result in smaller phase error correction signals at the output of the PFD 414, which results in lower phase noise for the synthesizer. Unlike the fractional-N synthesizer 300, which requires a variable integer divider 302, the fractional-R synthesizer 300 requires a variable rational divider 406.

Figure 5:
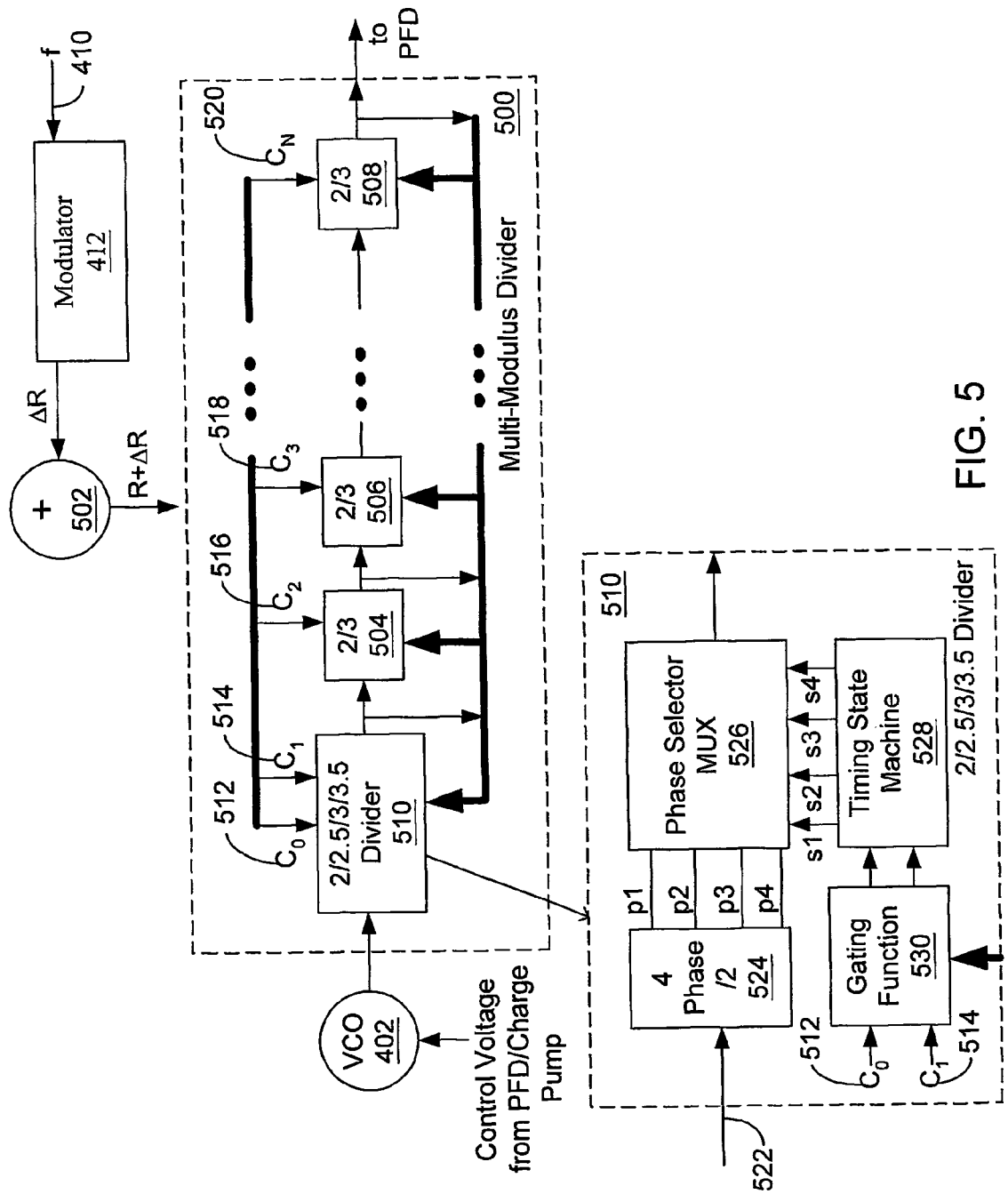
FIG. 5 is a block diagram of a multi-modulus divider approach with step size r=0.5 for use in the fractional-R synthesizer of FIG. 4.
Figure 6:
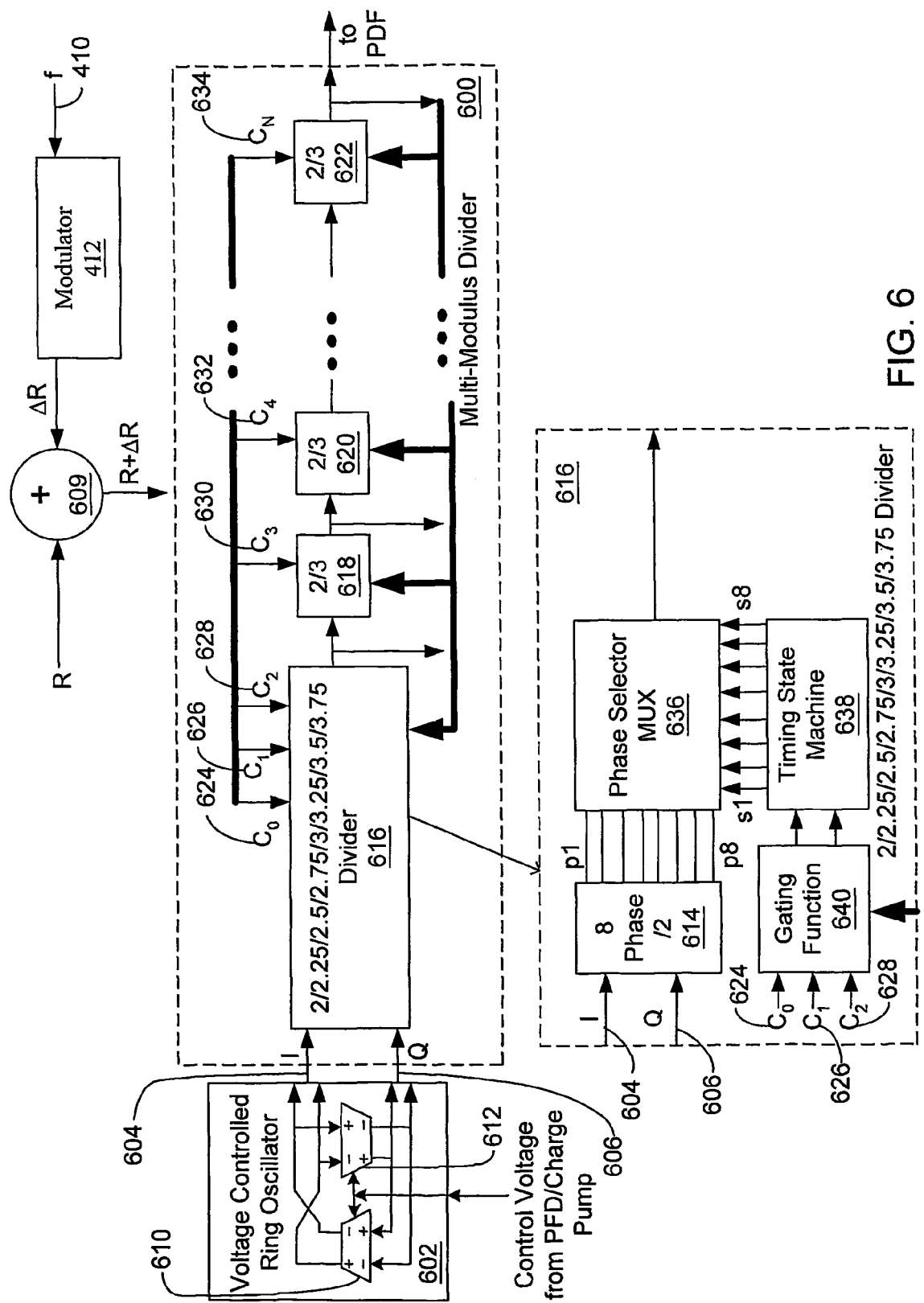
FIG. 6 is a block diagram of another multi-modulus divider approach with step size r=0.25 for use in the fractional-R synthesizer of FIG. 4.

Two embodiments are described in FIGS. 5 and 6, which use different methods of implementing the rational divider 406. The other components of the fractional-R synthesizer 400 including the modulator 412, PFD 414, charge pump and loop filter 416, are similar to the components used in the Fractional-N synthesizer 300 and conventional PLL synthesizer 100.

Turning to FIG. 5, a block diagram of a multi-modulus divider 500 with step size r=0.5 for use in the fractional-R synthesizer 400 of FIG. 4 is shown. The VCO 402 in this embodiment can be any type of voltage-controlled oscillator, with a single-phase differential output. We will focus in FIG. 5 on the multi-modulus divider 500, which can be varied with a minimum step size r=0.5. The module of the multi-modulus divider 500 is controlled by the signal "R+ΔR", which is the sum generated by a combiner 502 of the nominal fixed R and the dynamic modulation ΔR.

The multi-modulus divider 500 is essentially a chain of divide-by-2/3 stages 504, 506, and 508 except for the first stage 510. Each divide-by-2/3 stage 504, 506, and 508 divides by 2 or 3 depending on the control signal $C_x$, 512, 514, 516, 518, and 520, which is gated by the outputs of the following stages. The divide-by-3 operation is achieved by the skipping or swallowing of a clock edge in the 2/3 stage 504, 506, and 508. The gating of the control signal not shown explicitly and is assumed to be included in the 2/3 block. The gating function 530 is such that the control signal is only asserted when the outputs of all the following stages are equal to zero, which limits each stage to one cycle skip per period of the final output of the divider. In a standard divide-by-2/3 cascade with N stages, with the control signal gating as described above, the divider value is given by $D=2^N+C_0 2^0+C_1 2^1+\ldots+C_{N-1}2^{N-1}$. However, the first stage 510 in the multi-modulus divider 500 may divide by 2, 2.5, 3 or 3.5, and is followed by N−1 standard 2/3 stages 504, 506, and 508. It follows that the divide value, or ratio of input cycles to output cycles, for the multi-modulus divider in FIG. 5 is given by:

$$R+\Delta R=2^N+C_0 2^{-1}+C_1 2^0+C_2 2^1+\ldots+C_N 2^{N-1}$$

For example, if N=4, then the range of the R+ΔR is given by:

$$16<R+\Delta R<31.5,\text{ with minimum step } r=0.5$$

or, $R+\Delta R=16, 16.5, 17, 17.5, \ldots, 31.5$

To illustrate the use of this multi-modulus divider 500 in a fractional-R synthesizer 400, let us assume that we need to synthesize a VCO 402 output of 460 MHz using a 26 MHz reference frequency 404. The required fractional divide value is given by 460/26=17.6923 . . . . The closest divide value, which can be achieved by the multi-modulus divider 500, which is less than 17.692, is 17.5. Thus, we set R=17.5. The remaining fraction which must be synthesized by the ΣΔ modulator 412 is (17.692−17.5)/0.5=0.384 . . . . Thus, f=0.3846 . . . . The actual binary number that is input to the modulator 412, a ΣΔ modulator, will depend on the resolution or number of input bits of the ΣΔ modulator 412. If the ΣΔ modulator has a 16 bit input then the input to the ΣΔ modulator is given by $2^{16}*0.3846\ldots$ rounded to the nearest integer=25206. The accuracy to which the fraction is synthesized depends on the number of bits or resolution of the accumulators in the modulator.

A block diagram of the divider 510 is also illustrated in more detail in FIG. 5. The input signal from the VCO 522 is first divided by a 4-phase divide-by-2 circuit 524, which uses both rising and falling edges of the VCO signal to produce 4 phases, each of which is separated by half a VCO cycle from the adjacent phase. By dynamically selecting and multiplexing different combinations of these 4 phases in the phase-selector MUX 526, the different divide values may be synthesized. The timing state machine circuit 528 controls the dynamic selection of the phases. The control signals $C_0$ 512 and $C_1$ 514 are gated by the outputs of the following 2/3 stages. M. H. Perrott, "Techniques for high data rate modulation and low power operation of fractional-N frequency synthesizers," Ph.D. dissertation, MIT, 1997, provides a detailed implementation description of the State Machine circuit and the gating logic used with a fractional-N frequency synthesizer and applicable to fractional-R frequency synthesizers.

Turning to FIG. 6, a block diagram of another multi-modulus divider 600 approach with minimum step size r=0.25 for use in the fractional-R synthesizer 400 of FIG. 4 is shown. In this embodiment the fractional-R synthesizer 400 uses a 2-stage differential voltage controlled ring oscillator 602 for the VCO 402 with two phases, I 604 and Q 606, available at its outputs. The phases are 90 degrees or a quarter of a VCO cycle apart. This enables the implementation of a multi-modulus divider 600 with a minimum step size of r=0.25. The moduli of the multi-modulus divider 600 is controlled by the signal "R+ΔR", which is the sum generated by a combiner 609 of the nominal fixed R and the dynamic modulation ΔR from modulator 412.

The implementation of the voltage controlled ring oscillator is described in detail in U.S. Pat. No. 5,917,383. The ring oscillator consists of two differential variable delay gates, which are controlled by a voltage input. Each delay gate provides a 90 degree phase shift at the frequency of oscillation, and 180 degrees of phase shift is provided by a wired inversion in the loop.

With the I 604 and Q 606 signals and their compliments, timing information is now available at every quarter of a VCO cycle. The 8 phase divide-by-2 circuit 614 uses the I 604 and Q 606 phases and their compliments to produce 8 phases at half the frequency. Using dynamic selection of a combination of these phases divide ratios in steps of 0.25 can be implemented. The 8-state divider 616 is followed by standard 2/3 stages 618, 620, 622. The divider 616 is controlled by control signal $C_0$ 624, $C_1$ 626, $C_2$ 628, while each divide-by-2/3 stage 618, 620, and 622 divides by 2 or 3 depending on the respective control signal 630, 632, and 634, which is gated by the outputs of the following stages. The ratio of output cycles to input cycles is then given by:

$$R+\Delta R=2^{N-1}+C_0 2^{-2}+C_1 2^{-1}+C_2 2^0+C_3 2^1\ldots+C_N 2^{N-2}$$

For example, if N=5, then the range of the R+ΔR is given by:

$$16<R+\Delta R<31.75,\text{ with minimum step } r=0.25$$

or, $R+\Delta R=16, 16.25, 16.5, 16.75, 17, \ldots, 31.75$

Following the same analysis as in FIG. 5, for a VCO frequency of 504 MHz and reference of 26 MHz, the required divide value is 19.3846 . . . . Thus R=19.25 and the fraction to synthesize is 0.1346/0.25=0.5385.

A block diagram of the divider 616 is also illustrated in more detail in FIG. 6. The 8-phase divide-by-2 circuit 614 to produce 8 phases (p1-p8) first divides the I 604 and Q 606 input signal from the Voltage Control Ring Oscillator 602. Each of the 8 phases is separated by 90 degrees of a VCO cycle from the adjacent phase. Dynamically selecting and multiplexing different combinations of these 8 phases in the phase-selector MUX 636 the different divide values may be synthesized. The timing state machine circuit 638 controls the dynamic selection of the phases with control signals s1-s8. The control signals $C_0$ 622, $C_1$ 624 and $C_2$ 626 are gated by the gating function 640 the output is then sent to the 2/3 stage 618.

One of the advantage of a fractional-R synthesizer over other known types of synthesizers is the reduction the minimum step size between different divider values, which reduces the perturbation of the PLL when the divider is dynamically switched from one divide value to the other in order synthesize the fraction. In a conventional PLL, once the loop is in perfect lock, no error signals should be produced by the PFD and charge pump. However, in an integrated circuit there are always offsets and charge leakage, which results in some correction signals being produced by the charge pump even when the PLL is locked. Furthermore, many phase detectors are designed to output minimum width up and down pulses when the loop is in lock, to ensure that a dead zone in the loop response is not encountered. The reference spurs in a conventional PLL are limited by the matching of the charge pump's UP and DOWN pulses. Also, while the charge pump pulses are ON low frequency noise in the charge pump and substrate can modulate the VCO and increase the synthesizer's phase noise.

In a fractional synthesizer using a $\Sigma\Delta$ modulator the PLL is constantly being pulled away from its ideal condition in order to synthesize the fraction. The PFD and charge pump try to compensate for the modulation of the divider by increasing the width of the charge pump currents. The greater the range of modulation of the divider, the more average time the charge pump will spend in the ON state, and the greater the noise coupled into the PLL. Thus, by minimizing the minimum step size, the fractional-R synthesizer minimizes the modulation range and the average ON-time of the charge pump currents, thus reducing the phase noise, which is the primary figure-of-merit of a synthesizer. Other advantages include reduction in the required resolution, size and power consumption of the accumulators used in the modulator.

Figure 7:
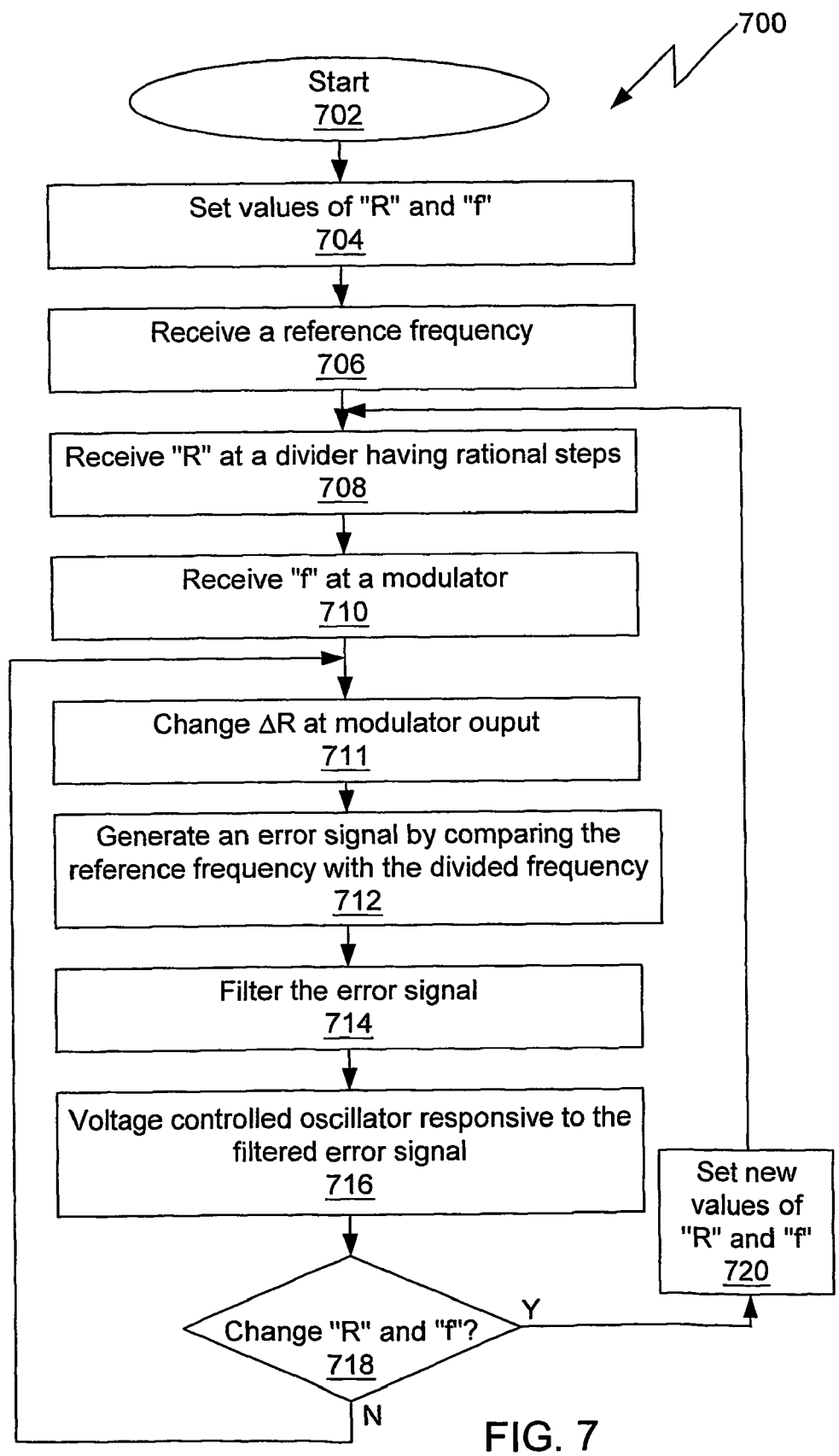
FIG. 7 is a process diagram for a fractional-R synthesizer of FIG. 4.

In FIG. 7, a process diagram 700 for a fractional-R synthesizer 400 of FIG. 4 is shown. The process starts 702 when the values for the rational divider value "R" 408 and fractional set "f" 410 are set 704 to an initial value for the fractional-R synthesizer 400. The divider 406 then receives 706 the rational divider value "R" that has been selected. A reference frequency 404 is also received 704 by the fractional-R synthesizer 400 at PFD 414.

The rational divider is received 708 at the divider 406 while the fractional value "f" is received 710 at the modulator. The modulator changes 711 its output ΔR for every cycle of the divider output. The divider 406 generates a divided frequency that is compared with the reference frequency at the PFD 414 that results in an error signal. The error signal is filtered 714 by the loop filter 416 resulting in a filtered error signal. The voltage-controlled oscillator 402 is responsive to the filtered error signal 716 in order to generate the desired frequency. The fractional-R synthesizer 400 may be dynamically changed during operation by selection of different "R" and "f" values 718. If new values are selected, they are then set 720 and the process is continued from step 708. Setting a value may be changing the electrical inputs to the divider 406 and modulator 412 or storing in a memory the values of "R" and "f" for processing by the divider 406 and modulator 412. The process is continuous as long as a system is powered.

The process in FIG. 7 may be performed by hardware or software. If the process is performed by software, the software may reside in software memory (not shown) in the wireless device or wireless network. The software in memory may include an ordered listing of executable instructions for implementing logical functions (i.e., "logic" that may be implement either in digital form such as digital circuitry or source code or in analog form such as analog circuitry or an analog source such an analog electrical, sound or video signal), may selectively be embodied in any computer-readable (or signal-bearing) medium for use by or in connection with an instruction execution system, apparatus, or device, such as a computer-based system, processor-containing system, or other system that may selectively fetch the instructions from the instruction execution system, apparatus, or device and execute the instructions. In the context of this document, a "computer-readable medium" and/or "signal-bearing medium" is any means that may contain, store, communicate, propagate, or transport the program for use by or in connection with the instruction execution system, apparatus, or device. The computer readable medium may selectively be, for example but not limited to, an electronic, magnetic, optical, electromagnetic, infrared, or semiconductor system, apparatus, device, or propagation medium. More specific examples "a non-exhaustive list" of the computer-readable medium would include the following: an electrical connection "electronic" having one or more wires, a portable computer diskette (magnetic), a RAM (electronic), a read-only memory "ROM" (electronic), an erasable programmable read-only memory (EPROM or Flash memory) (electronic), an optical fiber (optical), and a portable compact disc read-only memory "CDROM" (optical). Note that the computer-readable medium may even be paper or another suitable medium upon which the program is printed, as the program can be electronically captured, via for instance optical scanning of the paper or other medium, then compiled, interpreted or otherwise processed in a suitable manner if necessary, and then stored in a computer memory.

While various embodiments of the application have been described, it will be apparent to those of ordinary skill in the art that many more embodiments and implementations are possible that are within the scope of this invention. Accordingly, the invention is not to be restricted except in light of the attached claims and their equivalents.

What is claimed is:

1. A fractional-R synthesizer, comprising:
 a reference frequency source capable of generating a reference frequency signal;
 a controllable oscillator for generating a controlled frequency signal, the controllable oscillator responsive to an error signal;
 a variable rational divider for generating an output frequency signal, the variable rational divider coupled to the controllable oscillator to receive the controlled frequency signal, the variable rational divider having a divide ratio of the controlled frequency signal to the output frequency signal that is variable by sub-integer rational steps;

a comparator coupled to the variable rational divider to receive the output frequency signal and coupled to the reference frequency source to receive the reference frequency signal, the comparator operable to generate the error signal upon comparison of the output frequency signal and the reference frequency signal;

where the controllable oscillator, variable rational divider, and comparator connect to form a phase locked loop where an instantaneous ratio of the controlled frequency to the reference frequency is a rational number variable by sub-integer rational steps.

2. The fractional-R synthesizer of claim 1, further comprising:

a modulator, responsive to an input representing a fractional value and a clock input from the output of the variable rational divider that produces an output signal that modulates the divide ratio of the variable rational frequency divider.

3. The fractional-R synthesizer of claim 2, wherein the modulator is a sigma-delta modulator.

4. The fractional-R synthesizer of claim 1, further comprising:

a filter that filters the error signal from the comparator prior to providing the error signal to the controllable oscillator.

5. The fractional-R synthesizer of claim 1, wherein the controllable oscillator is a voltage controllable oscillator.

6. The fractional-R synthesizer of claim 1, wherein the variable rational frequency divider further comprises:

a multiple-phase divider for dividing the controlled frequency signal into a plurality of phases; and a phase selector for selecting one or more of the plurality of phases in response to timing signals generated by a state machine.

7. The fractional-R synthesizer of claim 6, wherein the frequency divider is implemented in a single integrated circuit.

8. The fractional-R synthesizer of claim 6, wherein the controllable oscillator is a voltage controlled ring oscillator oscillator; and wherein the voltage controlled ring oscillator generates an I component signal and a Q component signal as the controlled frequency signal provided to the multiple-phase divider.

9. A method for fractional-R synthesizing, comprising:

generating a reference frequency signal;

generating an output frequency signal using a variable rational frequency divider where a divide ratio of a controlled frequency signal to the output frequency signal is a plurality of rational values which differ by a minimum step less than unity;

generating an error signal by comparing the output frequency signal with the reference frequency signal; and changing the controlled frequency signal in response to the error signal; where an instantaneous ratio of the controlled frequency to the reference frequency is a rational number variable by sub-integer rational steps.

10. The method of claim 9, further comprising:

modulating an input representing a fractional value and a clock input from the output of the variable rational divider to produce an output signal that modulates the divide ratio of the variable rational frequency divider.

11. The method of claim 10, wherein modulating is done by a sigma-delta modulator.

12. The method of claim 9, further comprising:

filtering by a filter of the error signal prior to changing the controlled frequency signal.

13. The method of claim 9, wherein changing the controlled frequency signal is preformed by a controllable oscillator.

14. The method of claim 9, wherein selecting further comprises:

dividing a phase of the controlled frequency into a plurality of phases; and selecting in at least one phase selector one of the plurality of phases in response to timing signals generated by a state machine.

15. The method of claim 14, further including:

separating an I component signal and a Q component signal from the controlled frequency signal prior to dividing the phase of the controlled frequency signal.

16. A fractional-R synthesizer apparatus, comprising:

means for generating a reference frequency;

means for generating an output frequency signal where a divide ratio of a controlled frequency signal to the output frequency signal is a plurality of rational values which differ by a minimum step less than unity;

means for generating an error signal by comparing the output frequency signal with the reference frequency signal; and means for changing the controlled frequency signal in response to the error signal;

where an instantaneous ratio of the controlled frequency to the reference frequency is a rational number variable by sub-integer rational steps.

17. The apparatus of claim 16, further comprising:

means for modulating an input representing a fractional value and a clock input from the output of the means for generating the output frequency signal to produce an output signal that modulates the divide ratio of the means for generating the output frequency signal.

18. The apparatus of claim 16, further comprising:

means for filtering the error signal prior to providing to the means for changing.

19. The apparatus of claim 16, wherein the means for generating the output frequency further comprises:

means for dividing a phase of the controlled frequency signal into a plurality of phases; and means for selecting at least one of the plurality of phases in response to timing signals generated by a state machine.

20. The apparatus of claim 19, wherein the dividing means is implemented in a single integrated circuit.

21. The fractional-R synthesizer of claim 19, further including:

means for separating the controlled frequency signal into an I component signal and a Q component signal prior to dividing the phase of the controlled frequency signal.

22. A computer readable medium with machine-readable instruction sets that implement a method for fractional-R synthesizing, comprising instructions for the executing the steps of:

generating a reference frequency;

generating an output frequency signal using a variable rational frequency divider where a divide ratio of a controlled frequency signal to the output frequency signal is a plurality of rational values which differ by a minimum step less than unity;

generating an error signal by comparing the output frequency with the reference frequency; and changing the controlled frequency signal in response to the error signal; where an instantaneous ratio of the controlled frequency to the reference frequency is a rational number variable by sub-integer rational steps.

23. The computer readable medium with machine-readable instruction sets of claim 22, further comprising instructions for executing the step of:

modulating an input representing a fractional value and a clock input from the output of the variable rational divider to produce an output signal that modulates the divide ratio of the variable rational frequency divider.

* * * * *